(12) United States Patent
Ito et al.

(10) Patent No.: US 10,850,302 B2
(45) Date of Patent: Dec. 1, 2020

(54) LIQUID EJECTION DEVICE, NANOIMPRINTING APPARATUS, NANOIMPRINTING LIQUID STORAGE TANK, METHOD OF MANUFACTURING CURED PRODUCT PATTERN, METHOD OF MANUFACTURING OPTICAL COMPONENT, METHOD OF MANUFACTURING CIRCUIT BOARD, AND METHOD OF MANUFACTURING IMPRINTING MOLD

(71) Applicant: CANON KABUSHIKI KAISHA, Tokyo (JP)

(72) Inventors: Toshiki Ito, Kawasaki (JP); Yoshimasa Araki, Utsunomiya (JP); Kazumi Iwashita, Kobe (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 384 days.

(21) Appl. No.: 15/522,270

(22) PCT Filed: Oct. 5, 2015

(86) PCT No.: PCT/JP2015/005055
§ 371 (c)(1),
(2) Date: Apr. 26, 2017

(87) PCT Pub. No.: WO2016/067525
PCT Pub. Date: May 6, 2016

(65) Prior Publication Data
US 2017/0326583 A1    Nov. 16, 2017

(30) Foreign Application Priority Data

Oct. 30, 2014 (JP) ................................ 2014-222047
Feb. 27, 2015 (JP) ................................ 2015-039400
Jun. 25, 2015 (JP) ................................ 2015-128160

(51) Int. Cl.
*B05D 1/26* (2006.01)
*B05C 11/10* (2006.01)
(Continued)

(52) U.S. Cl.
CPC .................. *B05D 1/26* (2013.01); *B05C 5/00* (2013.01); *B05C 11/10* (2013.01); *B05D 3/06* (2013.01);
(Continued)

(58) Field of Classification Search
None
See application file for complete search history.

(56) References Cited

U.S. PATENT DOCUMENTS 5,300,628 A        4/1994  Honda
2004/0202787 A1 * 10/2004  Chia .................... B08B 3/02
                                                 427/256

(Continued)

FOREIGN PATENT DOCUMENTS

CN    103153042 A    6/2013
CN    103706523 A    4/2014
(Continued)

*Primary Examiner* — Jethro M. Pence
(74) *Attorney, Agent, or Firm* — Canon U.S.A., Inc. IP Division

(57) ABSTRACT

A liquid ejection device includes a storage section storing a nanoimprinting liquid and also includes an ejection port which communicates with the storage section and which ejects the nanoimprinting liquid. The storage section contains a sorption medium that adsorbs or absorbs at least one selected from the group consisting of particles, metal ions, and water. The sorption tedium is not ejected from the ejection port when the nanoimprinting liquid is ejected from the ejection port.

20 Claims, 7 Drawing Sheets

(51) Int. Cl.
*B05C 5/00* (2006.01)
*B05D 3/06* (2006.01)
*G03F 7/00* (2006.01)
*B82Y 10/00* (2011.01)

(52) U.S. Cl.
CPC ............ *G03F 7/0002* (2013.01); *B82Y 10/00* (2013.01); *G03F 7/00* (2013.01)

(56) References Cited

U.S. PATENT DOCUMENTS

| | | | |
|---|---|---|---|
| 2005/0239953 | A1 | 10/2005 | Sakurai |
| 2010/0266794 | A1* | 10/2010 | Wright .................... A61L 15/60 428/35.7 |
| 2011/0199423 | A1 | 8/2011 | Shimazaki |
| 2013/0213824 | A1* | 8/2013 | Tom ....................... B65D 25/14 206/0.7 |
| 2013/0288021 | A1 | 10/2013 | Hayashida |
| 2014/0097147 | A1 | 4/2014 | Yoshida |
| 2014/0270706 | A1 | 9/2014 | Pasko |
| 2015/0097900 | A1* | 4/2015 | Araki ..................... B29C 59/16 347/85 |

FOREIGN PATENT DOCUMENTS

| | | |
|---|---|---|
| CN | 104512118 A | 4/2015 |
| JP | H02-502443 A | 8/1990 |
| JP | H03-047559 A | 2/1991 |
| JP | H06-128321 A | 5/1994 |
| JP | H07-037388 U | 7/1995 |
| JP | 2000-193818 A | 7/2000 |
| JP | 2005-533393 A | 11/2005 |
| JP | 2006-091805 A | 4/2006 |
| JP | 2006-192785 A | 7/2006 |
| JP | 2008-041791 A | 2/2008 |
| JP | 2008-105360 A | 5/2008 |
| JP | 2008-200903 A | 9/2008 |
| JP | 2011-218315 A | 11/2011 |
| JP | 2012-195370 A | 10/2012 |
| JP | 2013-022807 A | 2/2013 |
| JP | 2014-078562 A | 5/2014 |
| KR | 10-2011-0046380 A | 5/2011 |
| KR | 10-2014-0043312 A | 4/2014 |
| WO | 2007/061068 A1 | 5/2007 |
| WO | 2012/096071 A1 | 7/2012 |

* cited by examiner

[Fig. 1]
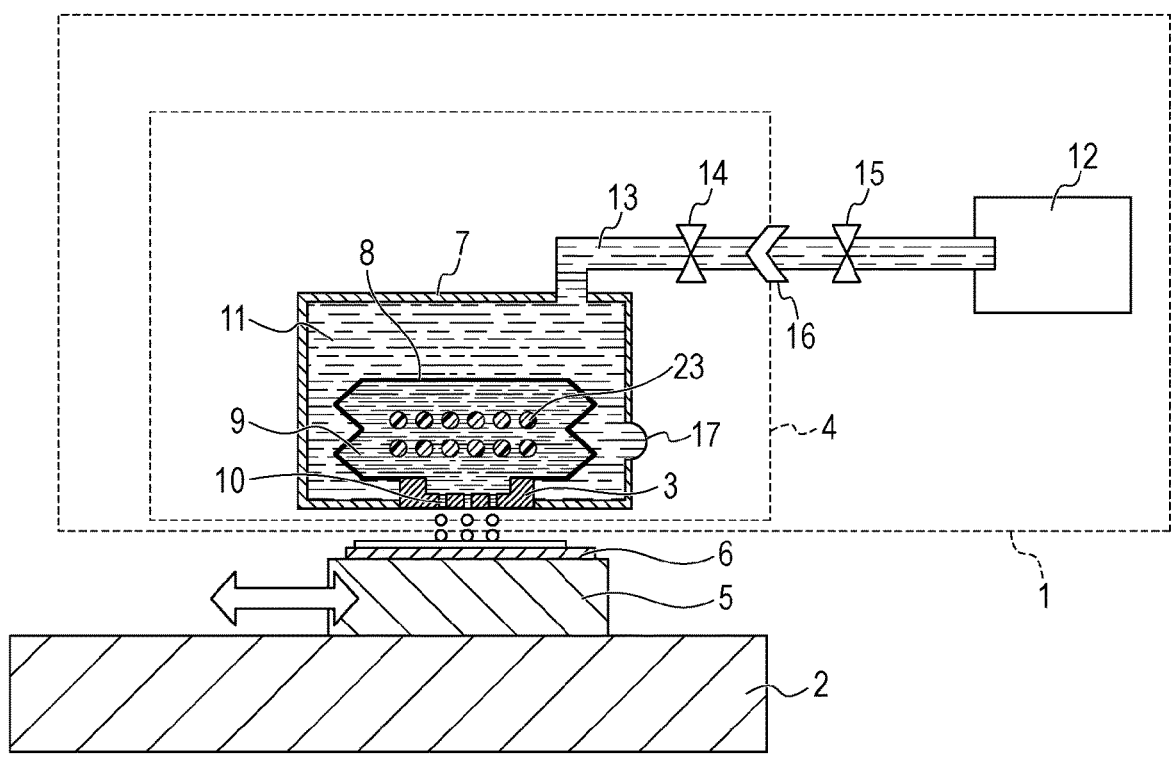

[Fig. 2]
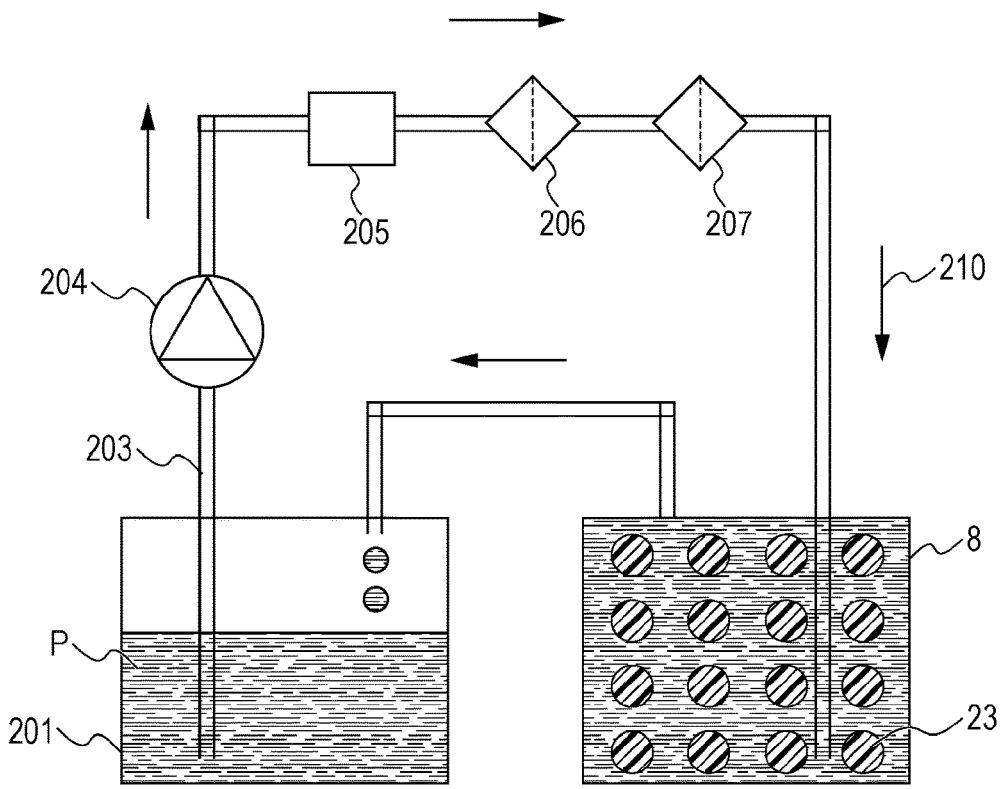
[Fig. 3A]
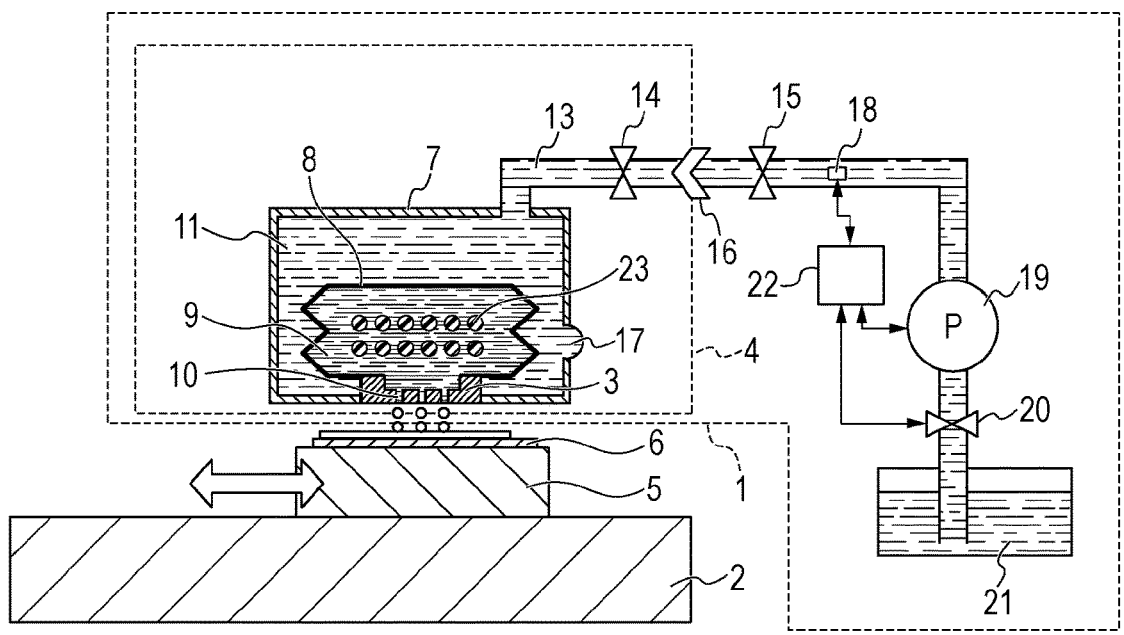

[Fig. 3B]
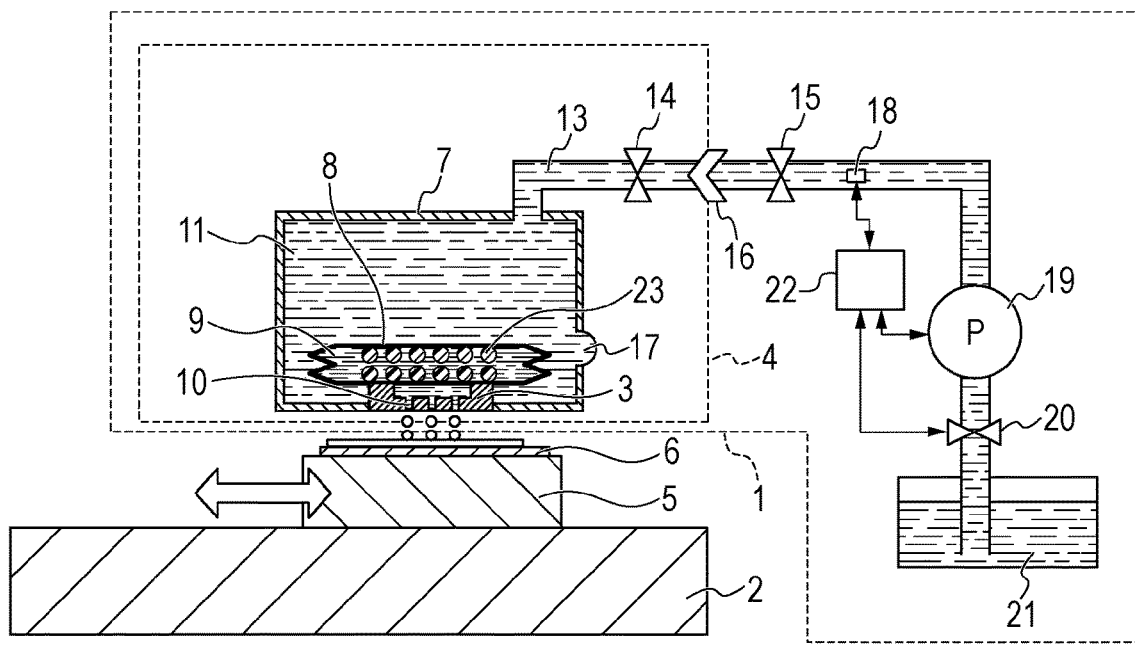

[Fig. 4]
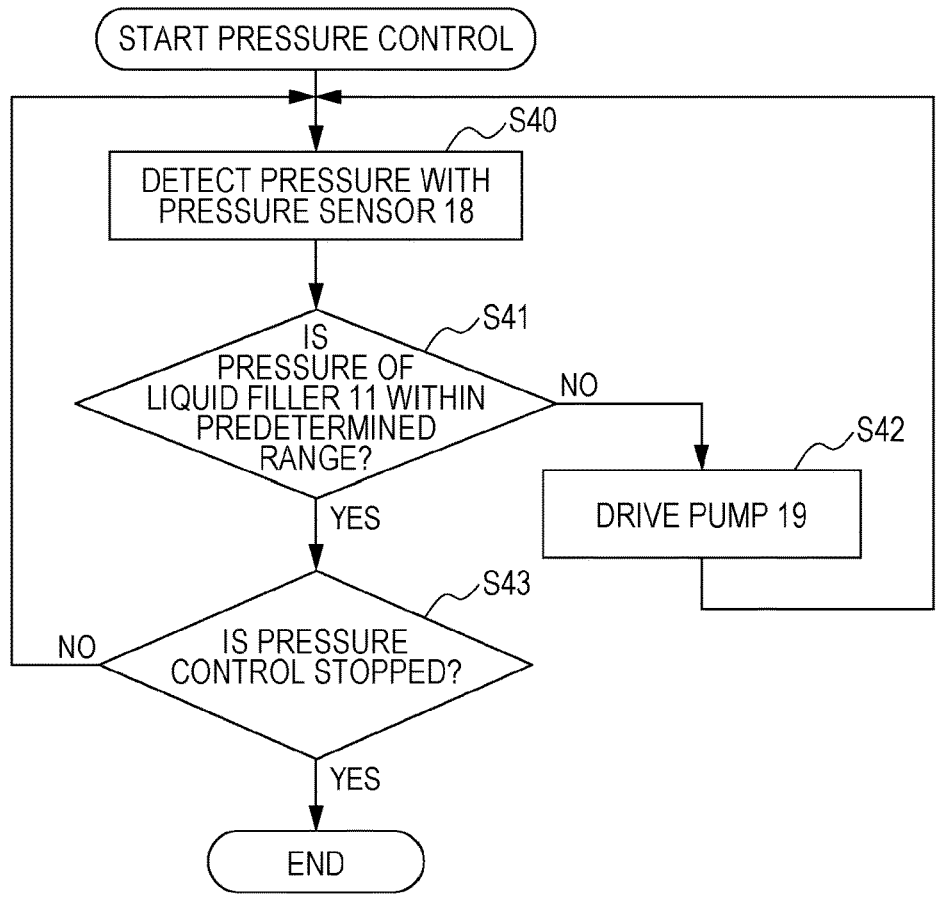
[Fig. 5A]
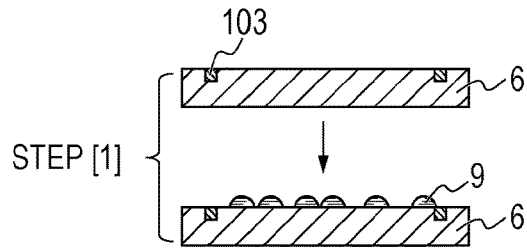
[Fig. 5B]
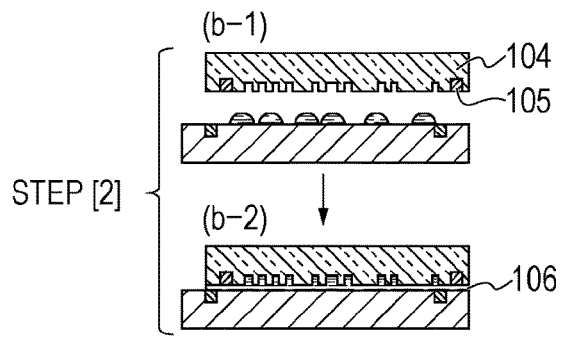

[Fig. 5C]
STEP [3]
[Fig. 5D]
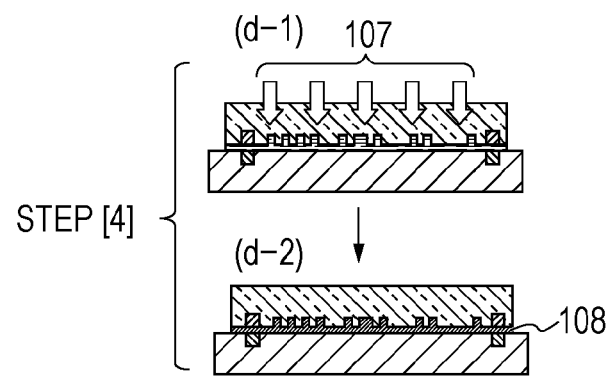
STEP [4]
[Fig. 5E]
STEP [5]
[Fig. 5F]
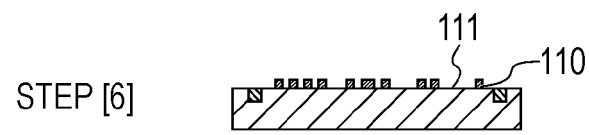
STEP [6]
[Fig. 5G]
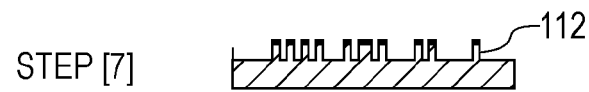
STEP [7]

[Fig. 6]
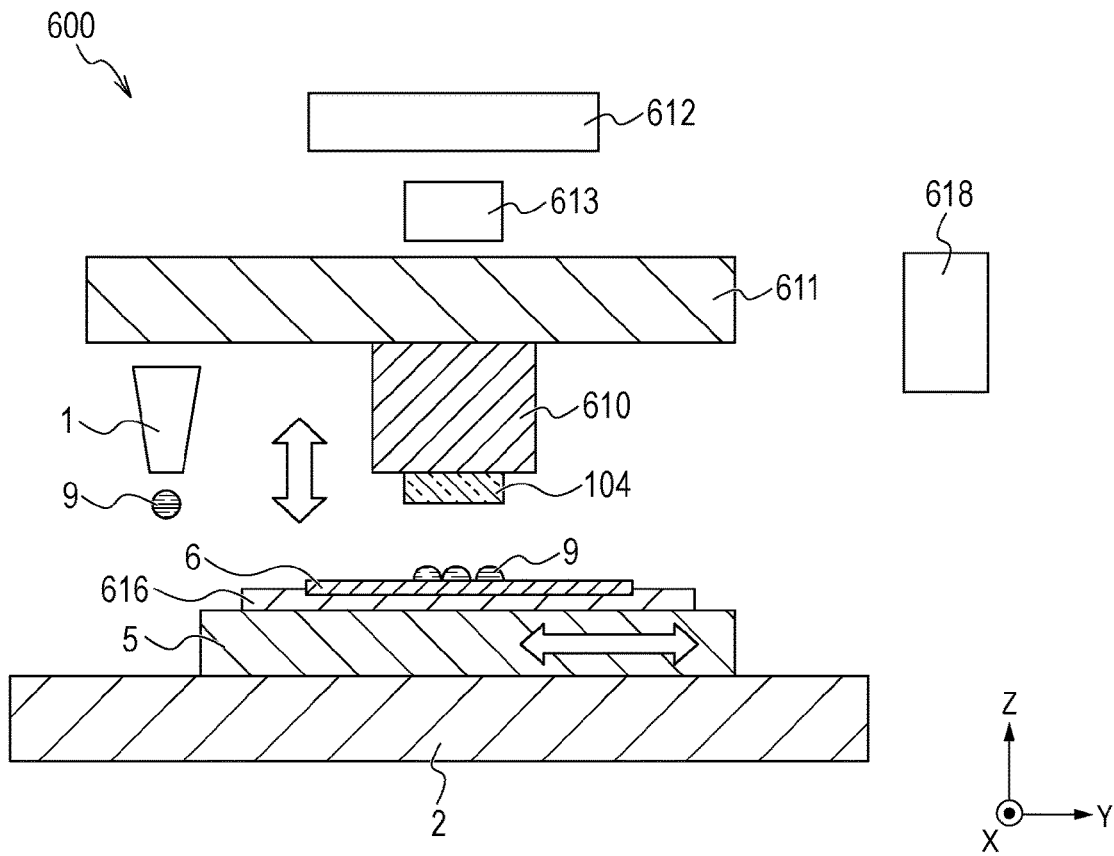
[Fig. 7A]
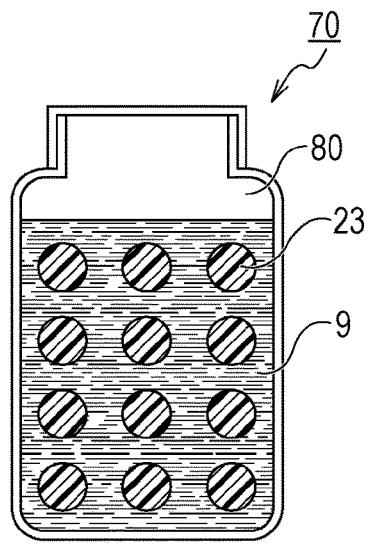

[Fig. 7B]
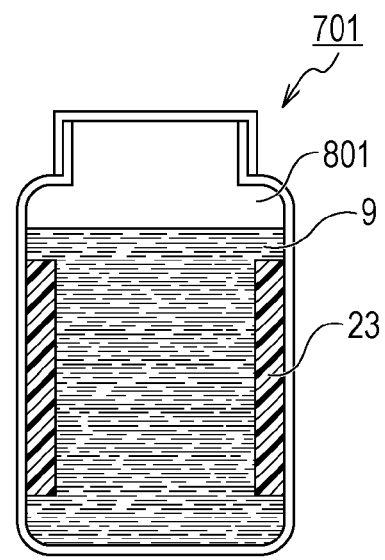

LIQUID EJECTION DEVICE, NANOIMPRINTING APPARATUS, NANOIMPRINTING LIQUID STORAGE TANK, METHOD OF MANUFACTURING CURED PRODUCT PATTERN, METHOD OF MANUFACTURING OPTICAL COMPONENT, METHOD OF MANUFACTURING CIRCUIT BOARD, AND METHOD OF MANUFACTURING IMPRINTING MOLD

TECHNICAL FIELD

The present invention relates to a liquid ejection device ejecting a nanoimprinting liquid, a nanoimprinting apparatus, a nanoimprinting liquid storage tank, a method of manufacturing a cured product pattern using the liquid ejection device, a method of manufacturing an optical component, a method of manufacturing a circuit board, and a method of manufacturing an imprinting mold.

BACKGROUND ART

In semiconductor devices, microelectromechanical systems (MEMSs), and the like, requirements for microfabrication have been increasing. In particular, a photonanoimprinting technique has been attracting attention.

In the photonanoimprinting technique, a photocurable composition (resist) is cured in such a state that a mold having a surface with a fine irregular pattern is pressed against a substrate (wafer) coated with the photocurable composition. This transfers the irregular pattern of the mold to a cured product of the photocurable composition, thereby forming the irregular pattern on the substrate. The photonanoimprinting technique is capable of forming a fine structure (cured product pattern) on the order of several nanometers.

In the photonanoimprinting technique, a photocurable composition is applied to a pattern-forming region of the substrate (a placement step). Next, the photocurable composition is molded using a mold having a pattern (a mold-contacting step). The photocurable composition is cured by irradiating the photocurable composition with light (a light irradiation step) and is then demolded (a demolding step). Performing these steps allows a resin pattern (photocured film) having a predetermined shape to be formed on the substrate (see PTL 1).

In the placement step of the photonanoimprinting technique, a liquid ejection device including a liquid ejection head (hereinafter simply referred to as "head") can be used as a device for applying the photocurable composition to the substrate. PTL 2 describes a liquid ejection device for ejecting a common liquid such as ink, that is, a liquid ejection device including a hermetically sealed housing, a tank placed in the housing, and a head communicating with the tank. Liquid (ink) to be ejected is stored in a storage space in the tank. The liquid (ink) stored in the tank is supplied to the head and is then ejected from the head.

In the photonanoimprinting technique, molding is performed by pressing a mold against a nanoimprinting liquid, such as a photocurable composition, applied in the placement step. Therefore, when, for example, gelled or solid foreign particles (hereinafter referred to as "particles") with a diameter of several nanometers to several micrometers are present in the nanoimprinting liquid applied in the placement step, the mold is damaged or a formed pattern has defects. Therefore, the concentration of the particles in the nanoimprinting liquid is preferably low.

Alternatively, when metal impurities such as metal ions or fine metal particles are present in the nanoimprinting liquid, a processed substrate is contaminated with the metal impurities and therefore semiconductor properties of semiconductor devices are affected. Thus, the concentration of the metal impurities in the nanoimprinting liquid is preferably low.

When water is present in the nanoimprinting liquid, properties such as curing properties of the nanoimprinting liquid may possibly be reduced. Therefore, the concentration of water in the nanoimprinting liquid is preferably low.

In the case where the liquid ejection device described in PTL2 is applied to a nanoimprinting apparatus and the nanoimprinting liquid is stored in a storage section, the concentration of particles, metal impurities, or water due to various components of the liquid ejection device may possibly increase with time. Therefore, there is a problem in that storing the nanoimprinting liquid in the storage section increases the concentration of the particles, metal impurities, or water in the nanoimprinting liquid with time.

In the present invention, the increase in concentration of particles, metal impurities, or water in a nanoimprinting liquid stored in a storage section with time is suppressed.

CITATION LIST

Patent Literature

PTL 1: PCT Japanese Translation Patent Publication No. 2005-533393

PTL 2: Japanese Patent Laid-Open No. 2006-192785

SUMMARY OF INVENTION

A liquid ejection device as an aspect of the present invention includes a storage section storing a nanoimprinting liquid and also includes an ejection port which communicates with the storage section and which ejects the nanoimprinting liquid. The storage section contains a sorption medium that adsorbs or absorbs at least one selected from the group consisting of particles, metal ions, and water. The sorption medium is not ejected from the ejection port when the nanoimprinting liquid is ejected from the ejection port.

Further features of the present invention will become apparent from the following description of exemplary embodiments with reference to the attached drawings.

BRIEF DESCRIPTION OF DRAWINGS

FIG. 1 is a schematic view of a liquid ejection device according to an embodiment of the present invention.

FIG. 2 is an illustration showing a method of washing a sorption medium sealed in a liquid storage unit.

FIG. 3A is an illustration exemplifying a pressure regulator used in an embodiment of the present invention.

FIG. 3B is an illustration showing a state in which a storage bag contracts from a state shown in FIG. 3A.

FIG. 4 is a flowchart showing how the pressure of liquid filler is controlled.

FIG. 5A is a schematic sectional view showing a method of manufacturing a cured product pattern according to an embodiment of the present invention.

FIG. 5B is a schematic sectional view showing the method of manufacturing the cured product pattern.

FIG. 5C is a schematic sectional view showing the method of manufacturing the cured product pattern.

FIG. 5D is a schematic sectional showing method of manufacturing the cured product pattern.

FIG. 5E is a schematic sectional view showing the method of manufacturing the cured product pattern.

FIG. 5F is a schematic sectional view showing the method of manufacturing the cured product pattern.

FIG. 5G is a schematic sectional view showing the method of manufacturing the cured product pattern.

FIG. 6 is a schematic view of a nanoimprinting apparatus according to an embodiment of the present invention.

FIG. 7A is a schematic view of a nanoimprinting liquid storage tank according to an embodiment of the present invention.

FIG. 7B is a schematic view of a nanoimprinting liquid storage tank that is a modification of the nanoimprinting liquid storage tank shown in FIG. 7A.

DESCRIPTION OF EMBODIMENTS

Embodiments of the present invention are described below in detail with reference to the attached drawings. The present invention is not limited to the embodiments. Various modifications and improvements may be made to the embodiments on the basis of knowledge of those skilled in the art without departing from the spirit of the present invention. Such modifications and improvements are within the scope of the present invention.

Particles, Metal Impurities, or Water in Nanoimprinting Liquid

In the case of manufacturing a cured product pattern by a photonanoimprinting process, the presence of particles in a nanoimprinting liquid 9 (hereinafter referred to as the "liquid 9") may possibly cause the damage of a mold or failures such as defects in a formed pattern. When the mold is pressed against the liquid 9 on, for example, a substrate, a recessed portion of a pattern formed on a surface of the mold is expanded and therefore the mold may possibly be damaged. Alternatively, the particles are caught in a recessed portion of the mold surface and therefore the mold may possibly malfunction.

The term "particles" as used herein refers to fine foreign particles. The particles are gelled or solid particulate matter with a diameter of several nanometers to several micrometers. The particles include gelled or solid organic particles produced by partly polymerizing a nanoimprinting liquid and inorganic particles such as fine metal particles below.

The number of the particles in the liquid 9 is preferably as small as possible. The concentration of particles having a diameter of 0.1 μm or more in the liquid 9 is preferably 1 or less per mL and more preferably 0.1 or less per mL.

In order to minimize the number of the particles in the liquid 9 in the course of preparing the liquid 9, it is preferred that purification including filtration is sufficiently performed. Even if the liquid 9 is prepared by sufficiently performing purification so as to have a reduced particle concentration, the concentration of the particles in the liquid 9 may possibly increase gradually as time passes with the liquid 9 stored in a tank or the like. Therefore, it is required to suppress the increase in concentration of the particles in the liquid 9 with time.

In the case of fabricating a semiconductor device by the photonanoimprinting process, when the metal impurities are present in the liquid 9, a processed substrate is contaminated with the metal impurities by applying the liquid 9 to the processed substrate. As a result, semiconductor properties of the semiconductor device may possibly be affected. The term "metal impurities" as used herein refers to metal-containing fine particles or metal ions and particularly refers to fine particles or ions containing Na, Ca, Fe, K, Zn, Al, Mg, Ni, Cr, Cu, Pb, Mn, Li, Sn, Pd, Ba, Co, or Sr.

The concentration of the metal impurities in the liquid 9 is preferably low. The concentration of each metal impurity element in the liquid 9 is preferably 100 ppb (100 ng/g) or less and more preferably 1 ppb (1 ng/g) or less. The term "metal impurity element" as used herein refers to Na, Ca, Fe, K, Zn, Al, Mg, Ni, Cr, Cu, Pb, Mn, Li, Sn, Pd, Ba, Co, and Sr. Adjusting the concentration of these elements in the liquid 9 within the above range enables the influence of the liquid 9 on semiconductor properties of the semiconductor device to be reduced.

Thus, in order to minimize the concentration of the metal impurities in the liquid 9 in the course of preparing the liquid 9, it is preferred that purification including filtration is sufficiently performed. Even if the liquid 9 is prepared by sufficiently performing purification so as to have a reduced metal impurity concentration, as time passes with the liquid 9 stored in the tank or the like, the concentration of the metal impurities in the liquid 9 may possibly increase gradually due to the tank or the like. Therefore, it is required to suppress the increase in concentration of the metal impurities in the liquid 9 stored in the tank with time.

Furthermore, when water is present in the liquid 9, properties such as curing properties of the liquid 9 may possibly be reduced. When water is present in, for example, a photocurable composition cured by light including ultraviolet light, the sensitivity of the photocurable composition to light may possibly be reduced.

Therefore, the concentration of water in the liquid 9 is preferably minimized in the course of preparing the liquid 9. As time passes with the liquid 9 stored in the tank or the like, moisture in ambient air or water in liquid filler, containing water, for pressure regulation may possibly penetrate through a partition. In the case where water enters the liquid 9 from outside, properties such as curing properties may possibly be reduced and the liquid 9 may possibly be contaminated with metal ions from outside. Therefore, it is required to suppress the increase in concentration of water in the liquid 9 stored in the tank with time.

Liquid Storage Unit

A liquid storage unit 4 (hereinafter referred to as the "unit 4") according to an embodiment of the present invention includes a storage bag 8 storing the liquid 9 and a sorption medium 23 placed in the storage bag 8. That is, the unit 4 stores the sorption medium 23 and the liquid 9 in the storage bag 8. The storage bag 8 is placed in a storage section (housing 7) storing the liquid 9.

The sorption medium 23 adsorbs or absorbs at least one selected from the group consisting of the particles, the metal ions, and water. The term "sorption" as used herein refers to adsorption and/or absorption.

Sorption Medium

The unit 4 includes the sorption medium 23, which adsorbs or absorbs at least one selected from the group consisting of the particles, the metal ions, and water contained in the liquid 9 and is placed in the storage bag 8 storing the liquid 9. The sorption medium 23 is configured such that when the liquid 9 is ejected from ejection ports 10 of a head 3, the sorption medium 23 is not ejected from the ejection ports 10.

The sorption medium 23 and the liquid 9 are in contact with each other and therefore the particles, the metal ions, and/or water contained in the liquid 9 can be adsorbed on or absorbed in the sorption medium 23 and can be retained. Thus, even if impurities such as the particles, the metal ions, or water are generated in or enter the liquid 9 in the storage bag 8, the increase in concentration of the impurities in the liquid 9 with time can be suppressed because the impurities are retained with the sorption medium 23.

Since the sorption medium 23 is configured such that the sorption medium 23 is not ejected from the ejection ports 10 when the liquid 9 is ejected from the head 3, the particles, the metal impurities, or water can be prevented from being ejected from the ejection ports 10. Therefore, the yield of the photonanoimprinting process can be increased and various devices such as semiconductor devices can be fabricated in high yield.

The sorption medium 23 is preferably a porous medium. When the sorption medium 23 is porous, the ability of the sorption medium 23 to adsorb or absorb the particles can be increased. In the case where the sorption medium 23 has ion-exchange groups on a surface thereof as described below, when the sorption medium 23 is porous, the specific surface area of the sorption medium 23 can be made large and therefore the ability of the sorption medium 23 to adsorb the metal impurities can be increased. In the case where the sorption medium 23 contains a drying agent as described below, when the sorption medium 23 is porous, the specific surface area of the sorption medium 23 can be made large and therefore the adsorbability or absorbability of the sorption medium 23 can be increased.

The sorption medium 23 has pores. The pores preferably have an average diameter of 0.001 μm to 0.5 μm, more preferably 0.001 μm to 0.1 μm, and particularly preferably 0.005 μm to 0.1 μm. The use of the sorption medium 23, which has the pores with an average diameter within the above range, allows the particles to be efficiently adsorbed or absorbed. When the average diameter of the pores of the sorption medium 23 is greater than 0.5 μm or less than 0.001 μm, the ability of the sorption medium 23 to adsorb the particles and the metal ions tends to be low. Incidentally, the average diameter of the pores of the sorption medium 23 can be determined by, for example, a mercury intrusion method. The term "average diameter of pores" as used herein refers to the average diameter of the pores in such a state that the sorption medium 23 are washed and are dried.

Examples of the sorption medium 23 include porous polyolefin films such as polyethylene (PE) films and polypropylene (PP) films, porous fluororesin films such as polytetrafluoroethylene (PTFE) films, porous polyimide films, porous polyamide films such as nylon 6 films and nylon 6,6 films, cellulose, pearlite, diatomaceous earth, glass fibers, silica gel, activated carbon, zeolites, and molecular sieves. The sorption medium 23 may be (granular (spherical) or fibrous.

The sorption medium 23 is preferably made of a material such as cellulose, diatomaceous earth, polyethylene, nylon, activated carbon, or silica gel. This is because such a material contains none of, for example, metal elements, such as Al and Na, possibly responsible for the generation of the metal impurities. Nylon, diatomaceous earth, cellulose, and the like have polarity and an ability to adsorb the metal ions and therefore are particularly preferred.

In the present invention, the sorption medium 23 is preferably surface-modified with the ion-exchange groups. It is particularly preferred that the sorption medium 23 is porous and is surface-modified with the ion-exchange groups. This allows the contact area between the liquid 9 and the sorption medium 23 to be large and therefore allows the ability of the sorption medium 23 to adsorb the metal ions to be high. The inner surface of the storage bag 8 may be surface-modified with the ion-exchange groups.

The type of the ion-exchange groups is not particularly limited. The ion-exchange groups are preferably cation-exchange groups. The use of the cation-exchange groups enables the metal ions, which are cations, to be efficiently adsorbed. The ion-exchange groups are preferably sun groups and carboxyl groups that are cation-exchange groups.

As described above, surface-modifying the sorption medium 23 or the inner surface of the storage bag 8 with the ion-exchange groups enables the metal impurities, which are present in the liquid 9 in the form of ions, to be removed on the principle of ion exchange.

The sorption medium 23 surface-modified with the ion-exchange groups may be, for example, a Zeta Plus (registered trademark) EC Series Filter Disk B47-40QSH or Zeta Plus (registered trademark) EC Series Filter Disk B47-020GN (manufactured by 3M Japan Limited), which is a sorption medium composed of cellulose, diatomaceous earth, and an ion-exchange resin.

The sorption medium 23 surface-modified with the ion-exchange groups may be a fibrous ion-exchange resin. Preferred examples of the fibrous ion-exchange resin include IONEX (registered trademark) TIN-100 and IONEX (registered trademark) TIN-600 (both produced by Toray Fine Chemicals Co., Ltd.), IONEX (registered trademark) TIN-100 is a polystyrene/polyolefin composite fiber obtained by surface-modifying a polystyrene resin with sulfonic acid-exchange groups. IONEX (registered trademark) TIN-600 is a polystyrene/polyolefin composite fiber obtained by surface-modifying a polystyrene resin with iminodiacetic acid-exchange groups. IONEX (registered trademark) TIN-100 and IONEX (registered trademark) TIN-600 both have a fiber diameter of 40 μm and fiber length of 0.5 mm. These fibrous ion-exchange resins have excellent adsorbability and a large surface area, also have good chemical durability, and are preferred as the sorption medium 23.

When the sorption medium 23 is fibrous, the average diameter of the pores corresponds to the average diameter of spaces between intertwined fibers forming the sorption medium 23. The average diameter thereof can be measured in such a manner that a filter is prepared using the sorption medium 23 and gold nano-particles with a known diameter are passed through the filter.

When the sorption medium 23 is fibrous, the fibers preferably have a diameter of about 1 μm to 500 μm and more preferably 10 μm to 100 μm. The fibers preferably have a length of about 0.1 mm to 100 mm and more preferably 0.50 mm to 50 mm. When the diameter and length of the fibers are within the above ranges, the ability of the sorption medium 23 to adsorb the particles and the metal ions can be increased.

In this embodiment, the sorption medium 23 preferably contains the drying agent. When the sorption medium 23 contains the drying agent, water contained in the liquid 9 is adsorbed on or absorbed in the sorption medium 23 and therefore water can be prevented from being ejected from the ejection ports 10.

The drying agent is not particularly limited and may have a function of adsorbing or absorbing moisture. The drying agent may be, for example, a chemical or physical drying agent.

The chemical drying agent is one that exploits the chemical reactivity with water or deliquescence that is a property inherent in chemical substances. Examples of the chemical drying agent include calcium oxide, barium oxide, magnesium oxide, strontium oxide, lithium sulfate, sodium sulfate, gallium sulfate, titanium sulfate, nickel sulfate, lithium chloride, calcium chloride, magnesium chloride, aluminium chloride, calcium sulfate, magnesium sulfate, zinc sulfate, potassium acetate, dimethylamine hydrochloride, orthophosphoric acid, guanidine hydrochloride, guanidine phosphate, guanidine sulfamate, guanidine methylolphosphate, guanidine carbonate, potassium hydroxide, sodium hydroxide, magnesium hydroxide, phosphorus pentoxide, magnesium perchlorate, germanium oxide, potassium oxide, cesium oxide, sodium oxide, polyvinyl alcohol, starch-acrylic acid graft copolymers, starch-acrylonitrile graft copolymers, cellulose-acrylonitrile graft copolymers, crosslinked polyvinyl alcohol, crosslinked sodium polyacrylate, and saponified products of methyl acrylate-vinyl acetate copolymers.

The physical drying agent is one that exploits the adsorption of water molecules on a porous medium. Examples of the physical drying agent include activated carbon, silica gel, polyvinyl alcohol, calcined talc, and synthetic zeolites.

The drying agent preferably contains none of metal elements that may possibly affect semiconductor properties of semiconductor devices. That is, the drying agent preferably contains none of Na, Ca, Fe, K, Zn, Al, Mg, Ni, Cr, Cu, Pb, Mn, Li, Sn, Pd, Ba, Co, and Sr. The drying agent is preferably at least one selected from the group consisting of gallium sulfate, titanium sulfate, dimethylamine hydrochloride, orthophosphoric acid, guanidine hydrochloride, guanidine phosphate, guanidine sulfamate, guanidine methylolphosphate, guanidine carbonate, phosphorus pentoxide, polyvinyl alcohol, a starch-acrylic acid graft copolymer, a starch-acrylonitrile graft copolymer, a cellulose-acrylonitrile graft copolymer, crosslinked polyvinyl alcohol, a saponified product of a methyl acrylate-vinyl acetate copolymer, germanium oxide, cesium oxide, activated carbon, and silica gel.

The drying agent may further have an ability to adsorb the particles or the metal ions. Another sorption medium different from the sorption medium 23 may be used. That is, a plurality of sorption media including the sorption medium 23 may be used.

When the sorption medium 23 is not fixed to the inner surface of the storage bag 8, the sorption medium 23 is preferably suspended in the liquid 9 in the storage bag 8. When the sorption medium 23 is suspended in the liquid 9 in the storage bag 8, the ejection ports 10 are not blocked during the ejection of the liquid 9 and therefore the reduction of ejection performance can be suppressed. Thus, the density of the sorption medium 23 is preferably less than or equal to the density of the liquid 9. In particular, the density of the sorption medium 23 is preferably 30% to 100% of the density of the liquid 9, more preferably 50% to 100%, and particularly preferably 80% to 100%. When the density of the sorption medium 23 is within the above range, the sorption medium 23 can be suspended in the liquid 9.

The sorption medium 23 preferably has a size greater than the diameter of the ejection ports 10 such that the sorption medium 23 is not ejected from the ejection ports 10 when the liquid 9 is ejected from the head 3. The size of the sorption medium 23 is preferably 150% or more of the diameter of the ejection ports 10 and more preferably 200% or more. The size of the sorption medium 23 may be an effective diameter or equivalent diameter determined by, for example, a sedimentation method, a laser-scattering method, or a sieving method.

Alternatively, the sorption medium 23 may be fixed to the inner surface of the storage bag 8. That is, the sorption medium 23 may be attached to the inner surface of the storage bag 8. In this case, the sorption medium 23 may be fixed to the inner surface of the storage bag 8 in such a manner that the sorption medium 23 is attached to the inner surface of the storage bag 8 in the form of a film or the sorption medium 23 is attached to or embedded in the inner surface of the storage bag 8 in the form of spheres or particles. Alternatively, the sorption medium 23 may be fixed to the inner surface of the storage bag 8 with a fibrous member.

As described above, the sorption medium 23 is preferably placed so as not to block the ejection ports 10. If the sorption medium 23 is placed such that the ejection ports 10 are blocked, that is, passages of the liquid 9 are blocked, then ejection performance may possibly be reduced. If the liquid 9 is ejected by increasing the pressure in the storage bag 8 in this state, then other impurities such as nanobubbles or particles may possibly be generated in the ejected liquid 9. In this embodiment, the sorption medium 23 is suspended in the liquid 9 or fixed to the inner surface of the storage bag 8; hence, it can be avoided that the ejection ports 10 are blocked by the sorption medium 23. This allows the reduction of the above-mentioned ejection performance and the generation of impurities due to ejection to be suppressed.

Nanoimprinting Liquid Storage Tank

A nanoimprinting liquid storage tank 70 (hereinafter referred to as the "tank 70") according to an embodiment of the present invention is described below with reference to FIG. 7A. FIG. 7A is a schematic view of the tank 70.

The tank 70 includes a storage section 80 storing the liquid 9. The tank 70 contains the sorption medium 23. The sorption medium 23 is placed in the storage section 80 and adsorbs or absorbs the particles, metal ions, and/or water contained in the liquid 9. The material and properties of the sorption medium 23 are as described above.

As shown in FIG. 7A, in the tank 70, the sorption medium 23 is suspended in the liquid 9. FIG. 7B is a schematic view of a nanoimprinting liquid storage tank 701 that is a modification of the tank 70. The nanoimprinting liquid storage tank 701 includes a storage section 801 and the sorption medium 23 is fixed to the inner surface of the storage section 801.

The presence of the sorption medium 23 in the tank 70 as described above allows the increase in concentration of the particles, the metal impurities, or water in the liquid 9 with time to be suppressed while the liquid 9, which is used in a nanoimprinting process, is stored in the tank 70.

Nanoimprinting Liquid

The type of the liquid 9 is not particularly limited and may be a liquid material used the nanoimprinting process. Examples of the liquid 9 include, but are not limited to, (1) curable compositions, such as curable compositions for resists and curable compositions for forming mold replicas, for forming fine patterns and (2) cured layer-forming curable compositions such as adhesive layer-forming curable compositions, underlayer-forming curable compositions, intermediate layer-forming curable compositions, topcoat layer-forming curable compositions, and smooth layer-forming curable compositions.

The liquid 9 is preferably a photocurable composition P (hereinafter referred to as the "composition P"). The composition P, which is the liquid 9, is described below.

Photocurable Composition

The composition P contains a component (A) which is a polymerizable compound and a component (B) which is a photopolymerization initiator. The term "photocurable composition" as used herein refers to a composition cured by light irradiation. The composition P can be preferably used as a photonanoimprinting photocurable composition. The composition P, which contains the component (A) and the component (B), is not particularly limited and may be one cured by light irradiation. The composition P may contain, for example, a compound containing the component (A) and the component (B) in a molecule of the compound.

The term "cured product" as used herein refers to one obtained by partially or completely curing a polymer obtained by polymerizing a polymerizable compound contained in a photocurable composition. Incidentally, among cured products, one having an extremely small thickness as compared to the area thereof is described as a "cured film" in some cases. The shapes of a cured product and film are not particularly limited. The cured product and the cured film may have a surface pattern shape.

Component (A): Polymerizable Compound

The component (A) is the polymerizable compound. The term "polymerizable compound" as used herein refers to a compound that reacts with a polymerization factor (radical or the like) generated from the component (B) (photopolymerization initiator) to form a polymer film by a chain reaction (polymerization reaction).

An example of the polymerizable compound is a radical polymerizable compound. The polymerizable compound, which is the component (A), may be composed of a single type of polymerizable compound or several types of polymerizable compounds.

The radical polymerizable compound is preferably a compound having one or more acryloyl or methacryloyl groups, that is, a (meth)acrylic compound.

Accordingly, the polymerizable compound, which is the component (A) of the composition P, preferably contains the (meth)acrylic compound. A major component of the component (A) is more preferably the (meth)acrylic compound. The component (A) is most preferably the (meth)acrylic compound. Incidentally, the fact that a major component of the component (A) is the (meth)acrylic compound means that the (meth)acrylic compound accounts for 90% by weight or more of the component (A).

When the radical polymerizable compound is composed of several types of compounds having one or more acryloyl or methacryloyl groups, the radical polymerizable compound preferably contains a monofunctional (meth)acrylic monomer and a polyfunctional (meth)acrylic monomer. This is because a cured product with high mechanical strength is obtained using the monofunctional (meth)acrylic monomer and the polyfunctional (meth)acrylic monomer in combination.

Component (B): Photopolymerization Initiator

The component (B) is the photopolymerization initiator.

The term "photopolymerization initiator" as used herein refers to a compound that absorbs light with a certain wavelength to generate the polymerization factor (radical). In particular, the photopolymerization initiator is a polymerization initiator (radical generator) that generates a radical by light (an infrared ray, a visible ray, an ultraviolet ray, a far-ultraviolet ray, an X-ray, a charged-particle beam such as an electron beam, or radiation).

The component (B) may be composed of a single type of photopolymerization initiator or several types of photopolymerization initiators.

The amount of the component (B), which is the photopolymerization initiator, blended in the composition P is preferably 0.01% to 10% by weight of the component (A), which is the polymerizable compound, and more preferably 0.1% to 7% by weight.

When the amount of the component (B) is 0.01% by weight or more of the amount of the component (A), the curing rate of the composition P is high and therefore the efficiency of reaction can be increased. When the amount of the component (B) is 10% by weight or less of the component (A), an obtained cured product has a certain mechanical strength.

Component (C): Another Additive Component

The composition P may further contain an additive component (C) in addition to the component (A) and the component (B) depending on various purposes unless effects of the present invention are impaired. Examples of the additive component (C) include a sensitizer, a hydrogen donor, an internal mold release agent, a surfactant, an oxidation inhibitor, a solvent, a polymer component, and a polymerization initiator other than the component (B).

The sensitizer is a compound that is appropriately added for the purpose of promoting a polymerization reaction or increasing reaction conversion. An example of the sensitizer is a sensitizing dye.

The sensitizing dye is a compound which absorbs light with a specific wavelength, which is thereby excited, and which interacts with the photopolymerization initiator, which is the component (B). The term "interaction" as used herein includes the transfer of energy and the transfer of electrons from the excited sensitizing dye to the photopolymerization initiator, which is the component (B).

The sensitizer may be used alone or in combination with another sensitizer.

The hydrogen donor is a compound that reacts with initiation radicals generated from the photopolymerization initiator, which is the component (B), or radicals at growing ends in polymerization to generate more reactive radicals. The hydrogen donor is preferably used when the photopolymerization initiator, which is the component (B), is a photoradical generator.

The hydrogen donor may be used alone or in combination with another hydrogen donor. The hydrogen donor may have a function as a sensitizer.

When the composition P contains the sensitizer or the hydrogen donor as the additive component (C), the amount of the sensitizer or hydrogen donor contained in the composition P is preferably 0.01% to 20% by weight of the amount of the component (A), which is polymerizable compound, more preferably 0.1% to 5.0% by weight, and further more preferably 0.2% to 2.0% by weight. When the amount of the sensitizer contained therein is 0.1% by weight or more of the amount of the component (A), the effect of promoting polymerization can be effectively exhibited. When the amount of the sensitizer or hydrogen donor contained therein is 5.0% by weight or less of the amount of the component (A), a polymeric compound forming a prepared cured product has a sufficiently high molecular weight and dissolution failure in the composition P or the deterioration of the storage stability of the composition P can be suppressed.

The internal mold release agent may be added to the composition P for the purpose of reducing the interfacial bonding strength between a mold and resist, that is, the demolding force in a demolding step below. The term "internal" as used herein means that an agent is added to the composition P prior to a placement step below.

Examples of the internal mold release agent include surfactants such as silicone surfactants, fluorinated surfactants, and hydrocarbon surfactants. In this embodiment, the internal mold release agent is not polymerizable. The internal mold release agent may be used alone or in combination with another internal mold release agent.

When the composition P contains the internal mold release agent as the additive component (C), the amount of the internal mold release agent contained therein is preferably, for example, 0.001% to 10% by weight of the amount of the component (A), which is polymerizable compound, more preferably 0.01% to 7% by weight, and further more preferably 0.05% to 5% by weight.

The composition P may contain a solvent and preferably contains substantially no solvent. Herein, the fact that substantially no solvent is contained means that any solvent other than an unintentionally contained solvent such as an impurity is contained. That is, the content of the solvent in the composition P is preferably, for example, 3% by weight or less and more preferably 1% by weight or less. The term "solvent" as used herein refers to a solvent for common use in compositions or photoresists. The type of the solvent is not particularly limited and the solvent may be one which dissolves and uniformly disperses compounds used in this embodiment and which does not react with the compounds.

The ratio between the component (A) and the component (B) can be determined in such a manner that the composition P and/or a cured product obtained by curing the composition P is analyzed by infrared spectroscopy, ultraviolet spectroscopy, pyrolysis-gas chromatography-mass spectrometry, or the like. The ratio between the component (A) and component (B) in the composition P can be determined from the ratio between the component (A) and component (B) in the cured product. When the composition P contains the additive component (C), the ratio between the component (A), component (B), and additive component (C) in the composition P can be similarly determined.

Temperature of Photocurable Composition During Blending

When the composition P is prepared, the component (A) and the component (B) are mixed together under predetermined temperature conditions and are dissolved. In particular, the component (A) and the component (B) are mixed together within the range of 0° C. to 100° C. This applies to the case where the composition P contains the additive component (C).

Viscosity of Photocurable Composition

A mixture of components of the composition P that exclude the solvent preferably has a viscosity of 1 mPas to 100 mPas, more preferably 1 mPas to 50 mPas, and further more preferably 1 mPas to 6 mPas at 25° C.

When the viscosity thereof is 100 mPas or less, it does not take a long time to fill the composition P into a recessed portion of a fine pattern on a mold when the composition P is brought into contact with the mold. That is, the photo-nanoimprinting process can be performed with high productivity. Furthermore, pattern defects due to filling failures are unlikely to arise.

When the viscosity thereof is 1 mPas or more, uneven application is unlikely to occur during the operation of applying the composition P to a substrate. Furthermore, the composition P is unlikely to drain out of an end portion of the mold when the composition P is brought into contact with the mold.

Surface Tension of Photocurable Composition

The mixture of the components of the composition P that exclude the solvent preferably has a surface tension of 5 mN/m to 70 mN/m, more preferably 7 mN/m to 35 mN/m, and further more preferably 10 mN/m to 32 mN/m at 23° C. When the surface tension thereof is 5 mN/m or more, it does not take a long time to fill the composition P into the recessed portion of the fine pattern on the mold when the composition P is brought into contact with the mold.

When the surface tension thereof is 70 mN/m or less, the cured product obtained by curing the composition P has surface smoothness.

Method of Washing Sorption Medium and Method of Filling Photoradically Polymerizable Compound Into Liquid Storage Unit In this embodiment, before the composition P is filled into the storage bag 8 in the unit 4, the sorption medium 23 is preferably sufficiently washed in advance such that the sorption medium 23 does not act as a source of the particles or the metal impurities. The configuration of the unit 4 is described below. An example of a method of washing the sorption medium 23 is described with reference to FIG. 2.

The composition P stored in a vessel 201 is pumped up with a pump 204 through a communicator 203 such as a tube. The composition P is fed from the pump 204 to the storage bag 8 in the unit 4 through the communicator 203, a particle counter 205, a particle filter 206, and a metal impurity removal filter 207. The sorption medium 23 is placed in the storage bag 8 in advance. After the storage bag 8 is filled with the composition P, the overflowing composition P is fed back to the vessel 201 through the communicator 203.

While the operation of the pump 204 is continued, the composition P passes through the particle filter 206 and the metal impurity removal filter 207 several times. This allows the particles or the metal impurities to be removed. If the particles or the metal impurities are generated from the sorption medium 23, the particles or the metal impurities drain into the composition P and are removed in the above course.

The concentration of the particles in the composition P is measured with the particle counter 205 as required. After the concentration of the particles in the composition P reaches a predetermined value or less, the pump 204 is stopped and the unit 4 is separated from the communicator 203 and is then hermetically sealed.

The content of the metal impurities in the composition P may be checked in such a manner that an adequate amount of the composition P is taken from the vessel 201 at a predetermined moment and metal elements are determined. After the content of the metal impurities in the composition P reaches a predetermined value or less, the pump 204 may be stopped.

Examples of the pump 204 include tube pumps, diaphragm pumps, and gear pumps. Examples of the particle counter 205 include Liquid-borne Particle Sensor KS Series (manufactured by RION Co., Ltd.), Liquid Particle Counter UltraChem Series (manufactured by Particle Measuring Systems, Inc.), Liquid Particle Counter SLS Series (manufactured by Particle Measuring Systems, Inc.), and Liquid Particle Counter HSLIS Series (manufactured by Particle Measuring Systems, Inc.).

Examples of the particle filter 206 include "Ultipleat P-Nylon 66" (manufactured by Nihon Pall, Ltd.), "Ultipor N66" (manufactured by Nihon Pall, Ltd.), "P Emflon" (manufactured by Nihon Pall, Ltd.), "LifeASSURE PSN Series" (manufactured by Sumitomo 3M Limited), "LifeASSURE EF Series" (manufactured by Sumitomo 3M Limited), "Photoshield" (manufactured by Sumitomo 3M Limited), "Electropor II EF" (manufactured by Sumitomo 3M Limited), "Microgard" (manufactured by Nihon Entegris K.K.), "Optimizer D" (manufactured by Nihon Entegris K.K.), "Impact Mini" (manufactured by Nihon Entegris K.K.), and "Impact 2" (manufactured by Nihon Entegris K.K.). These filters may be used alone or in combination.

Examples of the metal impurity removal filter 207 include "Zeta Plus GN Grade" (manufactured by Sumitomo 3M Limited), "Electropor" (manufactured by Sumitomo 3M Limited), "Posidyne" (manufactured by Nihon Pall, Ltd.), "Ionkleen AN" (manufactured by Nihon Pall, Ltd.), "Ionkleen SL" (manufactured by Nihon Pall, Ltd.), and "Protego" (manufactured by Nihon Entegris K.K.). These filters may be used alone or in combination.

The particle filter 206 and the metal impurity removal filter 207 preferably have a pore size of, for example, 0.001 µm to 5.0 µm and more preferably 0.003 µm to 0.01 µm. When the pore size of the particle and metal impurity removal filters 206 and 207 is greater than 5.0 µm, the ability of the particle and metal impurity removal filters 206 and 207 to adsorb the particles and the metal ions is low. When the pore size of the particle and metal impurity removal filters 206 and 207 is less than 0.001 µm, the particle and metal impurity removal filters 206 and 207 trap components of the composition P and therefore may possibly vary the composition of the composition P or may possibly be plugged.

The sorption medium 23 is preferably washed at a temperature of, for example, 0° C. to 80° C., more preferably 10° C. to 60° C., and particularly preferably 20° C. to 50° C. The pump 204 preferably has a flow rate of, for example, 0.01 mL/min to 100 mL/min and more preferably 1 mL/min to 10 mL/min.

Liquid Ejection Device

The present invention is applicable to any liquid ejection device including a hermetically sealed storage section storing a nanoimprinting liquid such as a photocurable composition. The term "liquid" as used herein includes fluids, such as sol-like substances, having relatively low viscosity. An example of a liquid ejection device according to an embodiment of the present invention is described below with reference to FIGS. 1, 4, and 5. The present invention is not limited to the example.

FIG. 1 is a schematic view of a liquid ejection device 1 (hereinafter referred to as the "device 1") according to an embodiment of the present invention. The device 1 is one ejecting the liquid 9. As shown in FIG. 1, the device 1 includes the unit 4 and a pressure regulator 12. The device 1 places the head 3, which is included in the device 1, opposite to a base plate 2. The device 1 can eject the liquid 9 onto a substrate 6 (processed substrate) placed on the base plate 2. The base plate 2 is overlaid with a transfer member 5. The substrate 6 is sucked onto the transfer member 5 using a sucking unit, which is not shown.

The unit 4 includes the head 3, the housing 7 (storage section), which is hermetically sealed, and the storage bag 8. The storage bag 8 is placed in the housing 7 and is flexible. A space in the housing 7 (storage section) is separated into a first storage space communicating with the ejection ports 10 of the head 3 and a second storage space isolated from the first storage space by the storage bag 8, which is a separator. In this embodiment, in the space in the housing 7, a space in the storage bag 8 forms the first storage space and a space outside the storage bag 8 forms the second storage space.

The present invention is not limited to a configuration in which the first storage space and the second storage space are separated from each other using the storage bag 8. The first storage space and the second storage space may be separated from each other using a flexible separator. The separator need not be pouched. The inside of the housing 7 may be separated into at least two spaces by, for example, a filmy flexible separator. The space in the storage bag 8 may be the second storage space and the space outside the storage bag 8 may be the first storage space.

In the case of storing liquid filler, described below, containing water in the second storage space, a separator made of a material which is poorly permeable to water is preferably used. Examples of such a material include tetrafluoroethylene-perfluoroalkyl vinyl ether copolymers (PFA), modified polytetrafluoroethylene (modified PTFE), nylon (Ny), low-density polyethylene (LDPE), and polypropylene (PP).

The liquid 9 is stored in the first storage space, that is, the space in the storage bag 8. The liquid 9 stored in the space in the storage bag 8 is supplied to the head 3 and is ejected from the ejection ports 10 of the head 3. The liquid 9 is preferably degassed in advance.

In the unit 4, the sorption medium 23 is stored in the first storage space, that is, the space in the storage bag 8. The sorption medium 23 may be suspended in the liquid 9 or may be fixed to the inner surface of the storage bag 8. It is preferred that the sorption medium 23 does not block the ejection ports 10.

The storage bag 8 is directly connected to the head 3 with no tube or valve therebetween. In this embodiment, since a sliding member such as valve is not used between the storage bag 8 and the head 3, the generation of the particles in the liquid 9 and the contamination of the liquid 9 with fine dust are suppressed.

The device 1 further includes liquid filler 11 which is fluid filled in the second storage space and a pressure regulator 12 regulating the pressure of the liquid filler 11 filled in the second storage space. The liquid filler 11 is fluid with no compressibility, that is, a non-compressible fluid and may be, for example, liquid or a gel-like substance. The liquid filler 11 is preferably a water-containing liquid or gel.

The second storage space, that is, a space in which the liquid filler 11 is filled is connected to the pressure regulator 12 through a communicator 13 such as a tube. The communicator 13 is provided with a valve 14, a valve 15, and a joint 16 placed between the valve 14 and the valve 15.

The joint 16 is composed of two separable joint portions (not shown). Since the communicator 13 is provided with the joint 16, the communicator 13 can be separated from the pressure regulator 12 at a position between the pressure regulator 12 and the valve 14. As a result, the unit 4 can be detached from a body of the device 1.

As described above, the unit 4 is configured to be detachable from the body of the device 1. This allows the device 1 to be made usable again only by replacing the unit 4 in the case where the unit 4 is damaged or the liquid 9 stored in the storage bag 8 runs out.

Before the unit 4 is detached from the body of the device 1, the valve 14 and the valve 15 are shut. The valve 14 is shut in such a state that the pressure in the housing 7 is maintained negative with the pressure regulator 12, whereby the pressure in the housing 7 is maintained negative. Therefore, the liquid 9 can be prevented from leaking from the ejection ports 10. The feed of the liquid filler 11 from the pressure regulator 12 is stopped by shutting the valve 15 and therefore the leakage of the liquid filler 11 can be prevented.

The liquid filler 11 is filled in the second storage space. The volume of liquid and gel is more unlikely to be affected by changes in temperature and pressure as compared to the volume of gas. Thus, even if the ambient temperature or pressure of the device 1 varies, the volume of the liquid filler 11 hardly varies and the change in pressure of the liquid 9 in the first storage space is suppressed.

A portion of the housing 7 may form a buffer 17. In particular, a portion of a wall of the housing 7 is made from a flexible film, whereby the buffer 17 is formed. The buffer 17 functions when the operation of the device 1 is stopped or power supply is cut off during the operation of the device 1.

The volume of the liquid filler 11 and the liquid 9 varies slightly due to, for example, a change in pressure or temperature. The buffer 17 absorbs pressure fluctuations due to the changes in volume of the liquid filler 11 and the liquid 9; hence, the pressure fluctuation of the liquid 9 in the first storage space is controlled to be small.

Since the volume of the liquid filler 11 is more unlikely to be affected by a change in temperature or pressure as compared to the volume of gas, this embodiment is more advantageous in that the buffer 17 can be downsized as compared to the case where gas is filled in the second storage space. The buffer 17 is not limited to a configuration in which the housing 7 is provided with the buffer 17. The communicator 13 may be provided with the buffer 17.

According to this embodiment, the liquid 9 is stored in the storage bag 8 and the liquid filler 11 is filled in a space between the outside of the storage bag 8 and the housing 7. Therefore, the storage bag 8 is hardly in contact with gas. Thus, gas hardly enters the storage bag 8 and the increase in pressure of the liquid 9 in the storage bag 8 can be suppressed.

A flexible member making up the storage bag 8 may be, for example, a member, such as an aluminium multilayer film, having low gas permeability. Even if bubbles are generated in the liquid filler 11, the use of such a member having low gas permeability suppresses the permeation of the bubbles into the storage bag 8 and therefore the increase in pressure of the liquid 9 in the storage bag 8 can be suppressed.

The liquid 9 is stored in the first storage space and the liquid filler 11 is filled in the second storage space. The difference in density between the liquid 9 and the liquid filler 11 is less than the difference in density between the liquid 9 and gas. Reducing the difference between the density of a substance stored in the first storage space and the density of a substance filled in the second storage space enables the swing of the storage bag 8 to be reduced when a shock is applied to the housing 7.

In the case where, for example, gas is filled in the second storage space, the density of the gas is negligibly small as compared to the liquid 9. In this case, the gas moves in accordance with the movement of the storage bag 8 storing the liquid 9. Thus, when a shock is applied to the housing 7, the gas hardly suppresses the movement of the storage bag 8 and therefore the storage hag 8 swings relatively significantly.

The liquid filler 11, which has a small difference in density from the liquid 9 stored in the first storage space, is filled in the second storage space. Therefore, the liquid filler 11 moves in the housing 7 independently of the movement of the storage bag 8 containing the liquid 9. That is, when a shock is applied to the housing 7, the movement of the liquid filler 11 and the movement of the storage bag 8 containing the liquid 9 suppress each other; hence, the swing of the storage bag 8 is reduced.

The liquid filler 11 preferably has a density ranging from 80% to 120% of the density of the liquid 9. When the liquid filler 11 has a density within this range, the swing of the storage bag 8 can be effectively reduced.

When gas is filled in the second storage space, the difference in density between the liquid 9 stored in the first storage space and the gas filled in the second storage space is regarded as 100%. When the liquid filler 11 has a density ranging from 80% to 120% of the density of the liquid 9, the difference in density between the liquid filler 11 and the liquid 9 is 20% or less. Therefore, the swing of the storage bag 8 can be reduced to one-fifth or less as compared to the case where gas is filled in the second storage space. As the difference in density between the liquid filler 11 and the liquid 9 is small, the storage bag 8 is unlikely to swing. The pressure fluctuation of the liquid 9 stored in the storage bag 8 is suppressed by reducing the swing of the storage bag 8.

According to this embodiment, the pressure fluctuation of the liquid 9 stored in the storage bag 8 can be suppressed as described above. Thus, the pressure fluctuation of the liquid 9 in the head 3, which communicates with the first storage space, is suppressed and the pressure in the head 3 is maintained negative. As a result, the leakage (liquid leakage) of the liquid 9 from the head 3 can be suppressed.

In this embodiment, for example, the volume of the housing 7 may be 400 mL, the initial volume of the liquid 9 may be about 250 mL, the volume of the sorption medium 23 may be 50 mL, and the initial volume of the liquid filler 11 may be about 100 mL. The present invention is not limited to this configuration. The volume of the housing 7, the initial volume of the liquid 9, the volume of the sorption medium 23, and the initial volume of the liquid filler 11 may be appropriately determined. For example, the volume of the housing 7 may be 400 mL, the volume of the sorption medium 23 may be 50 mL, the initial volume of the liquid 9 may be about 350 mL, and no liquid filler 11 may be filled in the second storage space in an initial state.

The flexible member making up the storage bag 8 has a thickness of about 10 μm to 200 μm and probably has a volume of about 5 mL to 6 mL at most. Thus, the volume of the flexible member making up the storage bag 8 is about 1% of the sum of the volume of the liquid filler 11 and the volume of the liquid 9 and is sufficiently small. Therefore, the difference in density between the flexible member making up the storage bag 8 and the liquid filler 11 and the difference in density between the flexible member making up the storage bag 8 and the liquid 9 are negligible.

An example of the flexible member making up the storage bag 8 is a laminate film, made of aluminium, having relatively high airtightness. The laminate film usually has a thickness of about 10 μm. The density of aluminium is 2.7 g/cm$^3$ and is considerably larger than the density of the liquid filler 11 and the density of liquid 9. The volume ratio of the storage bag 8 to the sum of the volume of the liquid filler 11 and the volume of the liquid 9 is less than 1%. Therefore, the density of the storage bag 8 is negligible.

The inside of the housing 7 is filled with the liquid 9 and the liquid filler 11; hence, the swing of the storage bag 8 can be reduced. As a result, the leakage of the liquid 9 from the ejection ports 10 can be suppressed.

In such a state that the unit 4 is on-board the unit 4, an external force is applied to the communicator 13 to cause the housing 7 to swing relatively significantly in some cases. Furthermore, the unit 4 moves in the device 1 in some cases. Even in these cases, the swing of the storage bag 8 in the unit 4 is reduced and therefore the leakage of the liquid 9 from the head 3 can be suppressed.

FIG. 3A is an illustration exemplifying the pressure regulator 12. As shown in FIG. 3A, the pressure regulator 12 may include a pressure sensor 18, a pump 19, a valve 20, a storage tank 21, and a controller 22.

The pressure sensor 18 is a pressure-measuring unit for measuring the pressure of the liquid filler 11 in the communicator 13. The pressure measured with the pressure sensor 18 is the relative pressure of the liquid filler 11 with respect to the pressure in the device 1. In order to avoid the influence of disturbance, the pressure sensor 18 is preferably placed close to the valve 15.

The liquid filler 11 is stored in the storage tank 21. The pump 19 transfers the liquid filler 11 between the storage tank 21 and the housing 7. Examples of the pump 19 include tube pumps, diaphragm pumps, and gear pumps. The valve 20 is located between the pump 19 and the storage tank 21 and is usually closed.

The pressure sensor 18 measures the pressure of the liquid filler 11 and transmits a signal corresponding to the pressure thereof to the controller 22. The controller 22 controls the operation of the valve 20 and the pump 19 on the basis of the pressure of the liquid filler 11 in the communicator 13. Driving the pump 19 in such a state that the valve 20 is open moves the liquid filler 11 between the storage tank 21 to adjust the pressure in the housing 7 to a predetermined value.

The operation of the device 1 is described below with reference to FIGS. 3B and 4. FIG. 3B is an illustration showing a state in which the storage bag 8 contracts from a state shown in FIG. 3A in association with the consumption of the liquid 9. FIG. 4 is a flowchart showing how the pressure of the liquid filler 11 is controlled using the pressure sensor 18 and the controller 22.

When the device 1 is started up, the controller 22 starts controlling the pressure in the housing 7.

Ejecting the liquid 9 from the ejection ports 10 of the head 3 reduces the amount of the liquid 9 stored in the storage bag 8 to reduce the volume of the storage bag 8. In such a state that the valve 20 is closed, the housing 7 and the communicator 13 are sealed; hence, the pressure of the liquid filler 11 in the housing 7 and the communicator 13 is reduced.

The controller 22 allows the pressure sensor 18 to measure the pressure of the liquid filler 11 in the communicator 13 (S40). The pressure sensor 18 transmits a signal corresponding to the measured pressure of the liquid filler 11 to the controller 22. The controller 22 controls the operation of the pump 19 and the valve 20 on the basis of a signal transmitted from the pressure sensor 18.

In particular, the controller 22 judges whether the pressure of the liquid filler 11 in the communicator 13 is within a predetermined range (S41). In the case where the controller 22 judges that the pressure of the liquid filler 11 in the communicator 13 is lower than the predetermined range, the controller 22 opens the valve 20 and drives the pump 19 (S42). The pump 19 feeds the liquid filler 11 from the storage tank 21 to the housing 7, whereby the pressure in the housing 7 is increased (filling step).

Thereafter, the pressure sensor 18 measures the pressure of the liquid filler 11 in the communicator 13 again (S40) and the controller 22 judges whether the pressure of the liquid filler 11 in the communicator 13 is within the predetermined range (S41). In the case where the controller 22 judges that the pressure of the liquid filler 11 in the communicator 13 is within the predetermined range, the controller 22 closes the valve 20 and stops the pump 19. As a result, the feed of the liquid filler 11 from the storage tank 21 to the housing 7 is stopped and the increase in pressure in the housing 7 is stopped.

The controller 22 controls the operation of the valve 20 and the pump 19 on the basis of results measured using the pressure sensor 18 as described above, whereby the pressure in the housing 7 is regulated within the predetermined range (pressure regulation step).

In the case where the pressure in the housing 7 is excessively increased, the liquid filler 11 is transferred from the housing 7 to the storage tank 21 using the pump 19. This allows the pressure in the housing 7 to be reduced.

After the pressure in the housing 7 is regulated, the controller 22 judges whether pressure control is stopped (S43). In the case where the controller 22 judges that pressure control is not stopped, the controller 22 allows the pressure sensor 18 to measure the pressure of the liquid filler 11 in the communicator 13 (S40).

In this embodiment, the pressure regulator 12 regulates the pressure of the liquid 9 in the head 3 as described above, whereby the meniscus of the liquid 9 in the ejection ports 10 is maintained well. Thus, the ejection stability of the head 3 is enhanced.

Since the liquid filler 11 is filled in the second storage space in association with the consumption of the liquid 9, the pressure of the liquid 9 in the head 3 is maintained regardless of the consumption of the liquid 9. This is advantageous for the device 1 when the housing 7 has a larger volume. Increasing the volume of the housing 7 enables the frequency of exchanging the unit 4 to be reduced.

Movable mechanisms such as pumps generally have a problem that particles are generated due to the operation thereof. In this embodiment, the pressure regulator 12 is not in direct contact with the liquid 9. Therefore, even if the particles are generated due to the operation of the pressure regulator 12, the particles enter the liquid filler 11 only and do not enter the liquid 9. Thus, there is an advantage that the contamination of the liquid 9 with the particles due to the pressure regulator 12 can be reduced.

According to this embodiment, the housing 7 is filled with the liquid 9 and the liquid filler 11 and therefore the pressure of the liquid 9 can be determined only by measuring the pressure of the liquid filler 11. The change in pressure of the liquid filler 11 is hardly affected by the deformation of the storage bag 8. Thus, the pressure of the liquid 9 is precisely determined by measuring the pressure of the liquid filler 11.

Since the pressure of the liquid 9 is precisely determined, the liquid 9 in the head 3 can be maintained at a desired negative pressure and the meniscus of the liquid 9 in the ejection ports 10 is maintained well. As a result, the ejection stability of the head 3 is enhanced.

Since the liquid filler 11 and the liquid 9 are liquid, the change in volume of the liquid filler 11 and the liquid 9 is less than that of gas and the pressure of the liquid filler 11 and the liquid 9 does not vary rapidly.

When the storage bag 8 contracts in association with the consumption of the liquid 9 as shown in FIG. 3B, the housing 7 is refilled with the liquid filler 11 depending on the contraction of the storage bag 8. The difference in density between the liquid filler 11 and liquid 9 is relatively small. Therefore, even if the volume ratio between the liquid filler 11 and liquid 9 in the housing 7 varies, the change in density in the housing 7 in association with the consumption of the liquid 9 is relatively small. Therefore, pressure fluctuations due to the change in volume ratio therebetween need not be compensated and the structure of the device 1 can be simplified.

Method of Manufacturing Cured Product Pattern

A method of manufacturing a cured product pattern according to an embodiment of the present invention is described below. FIGS. 5A to 5G are schematic sectional views showing the method of manufacturing the cured product pattern.

The method of manufacturing the cured product pattern includes a first step (1) of placing a photocurable composition on a substrate using the above-mentioned liquid ejection device, a second step (2) of bringing the photocurable composition into contact with a mold, a third step (4) of irradiating the photocurable composition with light to cure the photocurable composition into a cured product, and a fourth step (5) of separating the cured product obtained in the third step and the mold from each other.

The method of manufacturing the cured product pattern is one using the photo-nanoimprinting process.

The cured product pattern is preferably a cured product having a pattern with a size of 1 nm to 10 mm and more preferably 10 nm to 100 µm. In general, a pattern-forming technique for preparing a cured product having a pattern (irregular structure) with a nanometer size (1 nm to 100 nm) using light is referred to as the photonanoimprinting process. The method of manufacturing the cured product pattern uses the photonanoimprinting process.

Each step is described below.

Placement Step (1)

In this step (placement step), as shown in FIG. 5A, the liquid 9 is placed on (applied to) the substrate 6 using the device 1, whereby a wet film is formed.

The substrate 6, which is a target on which the liquid 9 is placed, is a processed substrate and is usually a silicon wafer. In the case of manufacturing an imprinting mold by the method of manufacturing the cured product pattern, the substrate 6 may be a quartz substrate. In the case of manufacturing the imprinting mold, the substrate 6 may be a quartz substrate having a metal compound layer (hard mask material layer) thereon.

In this embodiment, the substrate 6 is not limited to the silicon wafer or the quartz substrate. The substrate 6 may be arbitrarily selected from known semiconductor device substrates such as aluminium substrates, titanium-tungsten alloy substrates, aluminium-silicon alloy substrates, aluminium-copper-silicon alloy substrates, silicon oxide substrates, and silicon nitride substrates. The substrate 6 (processed substrate) used may be one, subjected to surface treatment including silane-coupling treatment, silazane treatment, and the formation of an organic thin-film, having increased affinity to the liquid 9.

The thickness of a shape-transferred layer (wet film) depends on applications thereof and is, for example, 0.01 µm to 100.0 µm.

Mold-Contacting Step (2)

Next, as shown in FIG. 5B, a mold 104, having a fine pattern, for transferring a pattern shape is brought into contact with the wet film, which is made of the liquid 9 and is formed in the prior step (placement step) (FIG. 5B1). This allows portions of the wet film, which is made of the liquid 9, to be filled into recessed portions of the fine pattern of the mold 104, whereby a coating film 106 is formed so as to be filled in the fine pattern of the mold 104 (FIG. 5B2).

The mold 104 is preferably made of a light-transmissive material in consideration of the next step (light irradiation step). In particular, a material making up the mold 104 is preferably glass, quartz, a transparent resin such as polymethyl methacrylate (PMMA) or polycarbonate, a transparent vapor-deposited metal film, a flexible film such as a polydimethylsiloxane film, a photocured film, a metal film or the like. In the case of using the transparent resin to make up the mold 104, the transparent resin needs to be selected so as not to be dissolved in a component contained in the liquid 9. The material making up the mold 104 is particularly preferably quartz because quartz has a small thermal expansion coefficient and the strain of a pattern is small.

The fine pattern of the mold 104 preferably has a height of 4 nm to 200 nm and an aspect ratio of 1 to 10.

In order to enhance the releasability of the mold 104 from the liquid 9, the mold 104 may be surface-treated prior to this step, which is a mold-contacting step of bringing the liquid 9 into contact with the mold 104.

In this step (mold-contacting step), the pressure applied to the liquid 9 when the liquid 9 is brought into contact with the mold 104 as shown in FIG. 5B1 is not particularly limited. In this step, the contact time of the liquid 9 with the mold 104 is not particularly limited.

This step may be performed under any one of air atmospheres, vacuum atmospheres, and inert atmospheres and is preferably performed under a vacuum or inert atmosphere because the influence of oxygen or moisture on a curing reaction can be prevented.

The mold-contacting step may be performed under an atmosphere (hereinafter referred to as the "condensable gas atmosphere") containing a condensable gas. The term "condensable gas" as used herein refers to gas that is condensed and liquefied by the capillary pressure generated when gas in an atmosphere is filled into the recessed portions of the fine pattern of the mold 104 and a gap between the mold 104 and the substrate 6 together with (portions of) the coating film 106. The condensable gas is present in an atmosphere before the liquid 9 (shape-transferred layer) is brought into contact with the mold 104 (FIG. 5B1).

Gas filled in the recessed portions of the fine pattern is liquefied by performing the mold-contacting step under the condensable gas atmosphere and therefore bubbles are eliminated; hence, filling properties are excellent. The condensable gas may be dissolved in the liquid 9.

Alignment Step (3)

Next, the position of the mold 104 and/or the position of the substrate 6 is adjusted as required such that a positioning mark 105 of the mold 104 coincides with a positioning mark 103 of the substrate 6. An alignment step is not essential and may be omitted depending on applications.

Light Irradiation Step (4)

Next, as shown in FIG. 5D, a portion of the liquid 9 that is in contact with the mold 104 is irradiated with light through the mold 104 in such a state that the mold 104 and the substrate 6 are aligned with each other in the alignment step. In particular, the coating film 106 filled in the fine pattern of the mold 104 is irradiated with light through the mold 104 (FIG. 5D1). This allows the coating film 106 filled in the fine pattern of the mold 104 to be cured by light, thereby forming a cured product 108 (FIG. 5D2).

The light applied to the liquid 9, which makes up the coating 106 filled in the fine pattern of the mold 104, is selected depending on the sensitivity wavelength of the liquid 9. In particular, ultraviolet light with a wavelength of 150 nm to 400 nm, an X-ray, an electron beam, or the like is appropriately selected and is preferably used.

The light (irradiation light 107) applied to the liquid 9 is particularly preferably ultraviolet light. This is because most of commercially available curing aids (photopolymerization initiators) are sensitive to ultraviolet light.

Demolding Step (5)

Next, the cured product 108 and the mold 104 are separated from each other. In this operation, the substrate 6 is overlaid with a cured film 109 having a predetermined pattern shape (cured product pattern).

In this step (demolding step), as shown in FIG. 5E, the cured product 108 and the mold 104 are separated from each other and the cured film 109 is obtained. The cured film 109 has a pattern shape, formed in the step (4) (light irradiation step), reverse to the fine pattern of the mold 104.

Through a series of steps (manufacturing process) including the above steps (1) to (5), the cured film 109 can be obtained so as to have a desired irregular pattern shape (a pattern shape following the fine pattern of the mold 104) located at a desired. position. The obtained cured film 109 can be used as, for example, an optical member such as a Fresnel lens or a diffraction grating (including the case where the cured film 109 is used as a component of an optical member). In this case, the following member can be obtained: an optical member including the substrate 6 and the cured film 109, which has a pattern shape, placed on the substrate 6.

In the method of manufacturing the cured product pattern, a repeating unit (shot) composed of the steps (1) to (5) can be repeatedly performed on the same processed substrate several times. Repeating the repeating unit (shot) composed of the steps (1) to (5) several times enables a cured film having a plurality of irregular pattern shapes (pattern shapes following the fine pattern of the mold 104) located at desired positions on the processed substrate to be obtained.

Residual Film-Removing Step (6) of Removing Portion of Cured Film

While the cured film 109, which is obtained in the demolding step, that is, the step (5), has a specific pattern shape, a portion of the cured film 109 sometimes remains in a region other than a region having this pattern shape (such a portion of the cured film 109 is hereinafter referred to as the "residual film"). In this case, as shown in FIG. 5F, the residual film located in a region that should be removed is removed from the cured film 109, which has an obtained pattern shape. This allows a cured product pattern 110 having a desired irregular pattern shape (a pattern shape following the fine pattern of the mold 104) to be obtained.

A method of removing the residual film is as follows: for example, the residual film, which is a recessed portion of the cured film 109, is removed by a process such as etching such that a surface of the substrate 6 is exposed through a recessed portion of a pattern owned by the cured film 109.

In the case of removing the residual film, which is the recessed portion of the cured film 109, by etching, a particular process used is not particularly limited and, for example, a known process such as dry etching can be used. For dry etching, a known dry etching system can be used.

The cured product pattern 110 can be obtained by a manufacturing process including the above steps (1) to (6) so as to have a desired irregular pattern shape (a pattern shape following the fine pattern of the mold 104) located at a desired position. An article having the cured product pattern 110 can be obtained. Furthermore, a substrate-processing step (step (7)) below is performed in the case of processing the substrate 6 using the cured product pattern 110.

An optical component can be obtained using the cured product pattern 110 as an optical member such as a diffraction grating or a polarizer (including the case where the cured product pattern 110 is used as a component of an optical member). In this case, the following member can be obtained: an optical member including the substrate 6 and the cured product pattern 110 placed on the substrate 6.

Substrate-Processing Step (7)

The cured product pattern 110, which is obtained in this embodiment, can be used as an interlayer insulating film for use in electronic components typified by semiconductor devices such as large-scale integrations (LSIs), system LSIs, dynamic random access memories (DRAMs), synchronous DRAMs (SDRAMs), Rambus DRAMs (RDRAMs), and Direct RDRAMs (D-RDRAMs). Furthermore, the cured product pattern 110 can be used as a resist film for semiconductor device fabrication.

In the case of using the cured product pattern 110 as a resist film, a portion (a region represented by reference numeral 111 in FIG. 5F) of the substrate 6 having a surface exposed in the residual film-removing step, that is, the step (6) is etched or is ion-implanted. In this operation, the cured product pattern 110 serves as an etching mask. In addition, a circuit structure 112 (FIG. 5G) based on the pattern shape of the cured product pattern 110 can be formed on the substrate 6 by forming an electronic component. This enables, for example, a circuit board for use in semiconductor devices such as LSIs, system LSIs, DRAMs, SDRAMs, RDRAMs, and D-RDRAMs to be manufactured. Furthermore, an electronic device such as a display, a camera, or a medical device can be formed by connecting the circuit board to a circuit control mechanism for the circuit board.

Likewise, an electronic component can be obtained in such a manner that etching, ion implantation, or the like is performed using the cured product pattern 110 as a mask (resist mask).

Alternatively, an imprinting mold can be manufactured in such a manner that a quartz substrate corresponding to the substrate 6 is etched using the cured product pattern 110. In this case, the quartz substrate, which corresponds to the substrate 6, may be etched using the cured product pattern 110 as a mask. Alternatively, the quartz substrate may be etched in such a manner that a second cured product is formed in a recessed portion of the cured product pattern 110 using a second curable material and is used as a mask.

Etching and ion implantation are described as a method of processing the substrate 6 using the cured product pattern 110 as a mask. The method of processing the substrate 6 is not limited to etching or ion implantation. For example, plating or the like may be performed in such a state that the cured product pattern 110 is placed on the substrate 6.

In the case of preparing the circuit board or the like, the cured product pattern 110 may be finally removed from the processed substrate 6 or may remain in the form of a member making up a device.

Other Embodiments

The device 1, which is applicable to a nanoimprinting apparatus, is described in the above embodiment. The present invention is not limited to the device 1. That is, the unit 4, which can be mounted to the device 1, is included in the present invention. The following apparatus is also included in the present invention: a nanoimprinting apparatus to which the device 1 can be mounted and which forms a resin pattern having a predetermined shape on a substrate by the above-mentioned photonanoimprinting process.

FIG. 6 is a schematic view of a nanoimprinting apparatus 600 according to an embodiment of the present invention. The nanoimprinting apparatus 600 is one that performs the photonanoimprinting process in such a manner that the liquid 9 placed on the substrate 6 is molded with the mold 104 and is then cured, the mold 104 is separated from the cured liquid 9, and a pattern is thereby transferred to the substrate 6. Details of the photonanoimprinting process are as described above.

The nanoimprinting apparatus 600 includes a mold head 610, a structural body 611, a light source 612, an illumination optical system 613, a base plate 2, a transfer section 5, and a control section 618. The nanoimprinting apparatus 600 further includes the device 1, which ejects the liquid 9. The device 1 is detachably mounted to a body of the nanoimprinting apparatus 600. The whole of the device 1 may be detachably mounted to the body of the nanoimprinting apparatus 600. Alternatively, a portion of the device 1, for example, the unit 4 only may be detachably mounted to the body of the nanoimprinting apparatus 600.

The mold head 610 is attached to the structural body 611 and serves as a holder that holds and moves the mold 104. The mold head 610 includes a mold chuck that vacuum-chucks or electrostatically chucks the mold 104 and also includes a movement mechanism for moving the mold 104. The mold head 610 has a function of pressing (bringing) the mold 104 against (into contact with) the uncured liquid 9 on the substrate 6 and separating (removing) the mold 104 from the cured liquid 9 on the substrate 6.

The light source 612 and the illumination optical system 613 form an irradiation system that emits light for curing the liquid 9 on the substrate 6. The light emitted from the light source 612 may be appropriately selected depending on the type of the liquid 9.

The base plate 2 is overlaid with the transfer section 5. The transfer section 5 holds and moves the substrate 6. The transfer section 5 includes a substrate chuck 616 that vacuum-chucks the substrate 6 and also includes a movement mechanism for moving the substrate 6.

The device 1 supplies the liquid 9 to the substrate 6. The liquid 9 can be applied to an upper region (shot region) of the substrate 6 in such a manner that the transfer section 5 is moved (scan-moved or step-moved) while the liquid 9 is being supplied from the device 1.

The control section 618 includes a central processing unit (CPU), a memory, and the like and controls the operation (photonanoimprinting process) of the nanoimprinting apparatus 600. In other words, the control section 618 comprehensively controls each section of the nanoimprinting apparatus 600 to perform the photonanoimprinting process. In particular, the control section 618 moves the mold head 610 and irradiates the liquid 9 with light from the light source 612 and the illumination optical system 613 in such a state that the mold 104 is pressed against the liquid 9 on the substrate 6, thereby curing the liquid 9. The control section 618 moves the mold head 610 to separate the mold 104 from the cured liquid 9 on the substrate 6, whereby a pattern of the mold 104 is transferred to the substrate 6.

EXAMPLES

The present invention is further described below in detail with reference to examples. The technical scope of the present invention is not limited to the examples below.

Example 1

First, a component (A), component (B), and additive component (C) below were blended together. The blend was filtered through a 0.2 μm mesh filter made of ultra-high molecular weight polyethylene, whereby a photocurable composition a was obtained.

(1-1) Component (A): 94 parts by weight in total
(A-1) Isobornyl acrylate (IB-XA™, produced by Kyoeisha Chemical Co., Ltd.): 9.0 parts by weight
(A-2) Benzyl acrylate (V#160™, produced by): 38.0 parts by weight
(A-3) Neopentyl glycol diacrylate (NP-A™, produced by Kyoeisha Chemical Co., Ltd.): 47.0 parts by weight (1-2) Component (B): 3.5 parts by weight in total
(B-1) Lucirin TPO (produced by BASF): 3 parts by weight
(B-2) 4,4'-bis(diethylamino)benzophenone (produced by Tokyo Chemical Industry Co., Ltd.): 0.5 parts by weight
(1-3) Additive component (C): 1.6 parts by weight
(C-1) polyoxyethylene stearyl ether SR-730 (produced by Aoki Oil Industrial Co., Ltd.): 1.6 parts by weight Subsequently, 100 ml of the photocurable composition a was measured and was then charged into a bottle, made of PFA, having a volume of about 100 mL. Thereafter, a sorption medium (p-1) was charged into the bottle containing the photocurable composition a. In this example, the sorption medium (p-1) used was a Zeta Plus (registered trademark) EC series filter disk, B47-40QSH, (a diameter of about 47 mm and a thickness of about 3 mm, manufactured by 3M Japan Limited). The sorption medium (p-1) was made of cellulose, diatomaceous earth, and an ion-exchange resin.

The sorption medium (p-1) was charged into the bottle and was then left stationary for one month. Thereafter, the content of each of metal elements (17 elements: Na, Ca, Fe, K, Zn, Al, Mg, Ni, Cr, Cu, Pb, Mn, Li, Sn, Ba, Co, and Sr) in the photocurable composition a was determined using an inductively coupled plasma (ICP) emission spectrometer, CIROS CCD, (manufactured by SPECTRO). Incidentally, before the sorption medium (p-1) was charged into the bottle, the metal elements were similarly determined.

Before the sorption medium (p-1) was charged into the bottle, 6.6 ppm of K was present in the photocurable composition a in the bottle. However, after the sorption medium (p-1) was charged into the bottle and was left stationary for one month, the concentration of K in the photocurable composition a was below the detection limit (1.1 ppm) of the ICP emission spectrometer. Before the sorption medium (p-1) was charged into the bottle, 4.5 ppm of Ni was present in the photocurable composition a in the bottle. However, after the sorption medium (p-1) was charged into the bottle and was left stationary for one month, the concentration of Ni in the photocurable composition a was 3.6 ppm. After the sorption medium (p-1) was charged into the bottle and was left stationary for one month, the concentration of each of the other metal elements in the photocurable composition a was below the detection limit of the ICP emission spectrometer.

The metal elements were present in the photocurable composition a at the point in time when the photocurable composition a was prepared and was charged into the bottle. In this example, the amounts of the metal elements could be reduced by adsorbing the metal elements onto the sorption medium (p-1). Accordingly, even if the photocurable composition a is contaminated with metal impurities when the photocurable composition a comes into contact with, for example, a metal member such as an inkjet head including ejection ports, the increase in amount of the metal impurities with time can probably be suppressed.

Example 2

After a photocurable composition a was prepared in the same manner as that described in Example 1, 100 ml of the photocurable composition a was measured and was then charged into a bottle, made of PFA, having a volume of about 100 mL. Thereafter, a sorption medium (p-2) was charged into the bottle containing the photocurable composition a. In this example, the sorption medium (p-2) used was a Zeta Plus (registered trademark) EC series filter disk, B47-020GN, (a diameter of about 47 mm and a thickness of about 3 mm, manufactured by 3M Japan Limited). The sorption medium (p-2) was made of cellulose, diatomaceous earth, and an ion-exchange resin.

The sorption medium (p-2) was charged into the bottle and was then left stationary for one month. Thereafter, the content of each of metal elements (17 elements: Na, Ca, Fe, K, Zn, Al, Mg, Ni, Cr, Cu, Pb, Mn, Li, Sn, Ba, Co, and Sr) in the photocurable composition a was determined using an ICP emission spectrometer, CIROS CCD, (manufactured by SPECTRO). Incidentally, before the sorption medium (p-2) was charged into the bottle, the metal elements were similarly determined.

Before the sorption medium (p-2) was charged into the bottle, 6.6 ppm of K was present in the photocurable composition a in the bottle. However, after the sorption medium (p-2) was charged into the bottle and was left stationary for one month, the concentration of K in the photocurable composition a was below the detection limit (1.1 ppm) of the ICP emission spectrometer. Before the sorption medium (p-2) was charged into the bottle, 4.5 ppm of Ni was present in the photocurable composition a in the bottle. However, after the sorption medium (p-2) was charged into the bottle and was left stationary for one month, the concentration of Ni in the photocurable composition a was 3.3 ppm. After the sorption medium (p-2) was charged into the bottle and was left stationary for one month, the concentration of each of the other metal elements in the photocurable composition a was below the detection limit of the ICP emission spectrometer.

The metal elements were present in the photocurable composition a at the point in time when the photocurable composition a was prepared and was charged into the bottle. In this example, the amounts of the metal elements could be reduced by adsorbing the metal elements onto the sorption medium (p-2). Accordingly, even if the photocurable composition a is contaminated with metal impurities when the photocurable composition a comes into contact with, for example, a metal member such as an inkjet head including ejection ports, the increase in amount of the metal impurities with tine can probably be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-222047, filed Oct. 30, 2014 and No. 2015-039400, filed Feb. 27, 2015 and No. 2015-128160, filed Jun. 25, 2015, which are hereby incorporated by reference herein in their entirety.

The invention claimed is:

1. A liquid ejection device comprising:
a storage section storing a liquid for nanoimprint; and
an ejection port which communicates with the storage section and which ejects the liquid for nanoimprint,
wherein the liquid ejection device is mounted to a nanoimprinting apparatus and can be detached from the nanoimprinting apparatus,
wherein the storage section contains a sorption medium that adsorbs or absorbs at least one selected from the group consisting of particles, metal ions, and water, and
wherein the sorption medium has a size greater than the diameter of the ejection port and is suspended in the liquid for nanoimprint in the storage section.

2. The liquid ejection device according to claim 1, wherein the sorption medium is a porous medium with an average pore diameter of 0.001 μm to 0.5 μm.

3. The liquid ejection device according to claim 1, wherein the sorption medium has a cation-exchange group on a surface thereof.

4. The liquid ejection device according to claim 1, wherein the sorption medium contains a physical or chemical drying agent.

5. The liquid ejection device according to claim 1, wherein the density of the sorption medium is 30% to 100% of the density of the liquid for nanoimprint.

6. The liquid ejection device according to claim 1, wherein a space in the storage section is separated into a first storage space which stores the liquid for nanoimprint and which communicates with the ejection port and a second storage space which does not communicate with the ejection port by a separator, the second storage space is filled with fluid, and the sorption medium is stored in the first storage space.

7. The liquid ejection device according to claim 6, further comprising:
a pressure regulator which communicates with the second storage space and which regulates the pressure of the fluid filled in the second storage space;
a communicator configured to communicate with the second storage space and the pressure regulator to each other; and
a valve provided in the communicator,
wherein the communicator is separable from the pressure regulator between the pressure regulator and the valve.

8. The liquid ejection device according to claim 6, wherein the fluid is a non-compressible fluid containing water.

9. The liquid ejection device according to claim 1, wherein the sorption medium is made of a material that is at least one selected from the group consisting of cellulose, diatomaceous earth, polyethylene, nylon, silica gel, and activated carbon.

10. The liquid ejection device according to claim 1, wherein the liquid for nanoimprint is a photocurable composition.

11. The liquid ejection device according to claim 1, wherein the sorption medium is not ejected from the ejection port when the liquid for nanoimprint is ejected from the ejection port.

12. The liquid ejection device according to claim 1, wherein the sorption medium is placed so as not to block passages of the liquid for nanoimprint.

13. The liquid ejection device according to claim 6, wherein the sorption medium is placed so as not to block passages of the liquid for nanoimprint.

14. The liquid ejection device according to claim 6, wherein the separator is a flexible member.

15. The liquid ejection device according to claim 6, wherein a volume of the first storage space decreases along with the ejection of the liquid for nanoimprint.

16. The liquid ejection device according to claim 6, wherein the separator has a thickness of from 10 μm to 200 μm.

17. The liquid ejection device according to claim 6, wherein the sorption medium is made of a material that is at least one selected from the group consisting of cellulose, diatomaceous earth, polyethylene, nylon, silica gel, and activated carbon.

18. The liquid ejection device according to claim 6, wherein the liquid for nanoimprint is a photocurable composition.

19. The liquid ejection device according to claim 1, wherein
an internal space of the storage section is separated into a first storage space which stores the liquid for nanoimprint and communicates with the ejection port, and a second storage space which does not communicate with the ejection port by a flexible separator,
the second storage space is filled with fluid, and
the sorption medium is fixed to the separator.

20. The liquid ejection device according to claim 19, wherein the flexible separator is made of a material that is at least one selected from tetrafluoroethylene-perfluoroalkyl vinyl ether copolymers (PFA), modified polytetrafluoroethylene (modified PTFE), nylon (Ny), low-density polyethylene (LDPE), and polypropylene (PP).

* * * * *